(12) United States Patent
Noma et al.

(10) Patent No.: US 6,493,196 B1
(45) Date of Patent: Dec. 10, 2002

(54) SPIN-VALVE MAGNETORESISTIVE SENSOR AND MAGNETIC HEAD HAVING SUCH A SPIN-VALVE MAGNETORESISTIVE SENSOR

(75) Inventors: Kenji Noma, Kawasaki (JP); Hitoshi Kanai, Kawasaki (JP); Junichi Kane, Kawasaki (JP); Kenichi Aoshima, Kawasaki (JP)

(73) Assignee: Fujitsu Ltd., Kawasaki (JP)

( * ) Notice: Subject to any disclaimer, the term of this patent is extended or adjusted under 35 U.S.C. 154(b) by 0 days.

(21) Appl. No.: 09/476,005

(22) Filed: Dec. 29, 1999

(30) Foreign Application Priority Data

Mar. 26, 1999 (JP) ............................. 11-084592

(51) Int. Cl.⁷ ............................. G11B 5/39; H04R 31/00
(52) U.S. Cl. ................................. 360/324.11; 29/603.08
(58) Field of Search ..................... 360/324.1, 324.11; 29/603.08

(56) References Cited

U.S. PATENT DOCUMENTS

| | | | | |
|---|---|---|---|---|
| 5,465,185 A | * | 11/1995 | Heim et al. ............. | 324/207.21 |
| 5,701,223 A | * | 12/1997 | Fontana et al. ......... | 360/324.11 |
| 5,828,529 A | * | 10/1998 | Gill ......................... | 360/324.11 |
| 5,880,913 A | * | 3/1999 | Gill ......................... | 360/324.11 |
| 5,898,549 A | * | 4/1999 | Gill ......................... | 360/324.11 |
| 6,038,107 A | * | 3/2000 | Pinarbasi ................ | 360/324.11 |

FOREIGN PATENT DOCUMENTS

| | | | | |
|---|---|---|---|---|
| JP | 9167318 | | 6/1997 | |
| JP | 10097709 | | 4/1998 | |
| JP | 11096516 | | 4/1999 | |
| JP | 2000182224 A | * | 6/2000 | ............ G11B/5/39 |

* cited by examiner

*Primary Examiner*—William Klimowicz
(74) *Attorney, Agent, or Firm*—Greer, Burns & Crain, Ltd.

(57) ABSTRACT

A spin-valve magnetoresistive sensor includes a free layer of a ferromagnetic material, a pinned layer provided on the free layer and a pinning layer of an anti-ferromagnetic material provided on the pinned layer, the anti-ferromagnetic material being an ordered alloy containing manganese. The pinned layer includes a first pinned layer of a ferromagnetic material, a second pinned layer of a ferromagnetic material provided on the first pinned layer and an intermediate layer interposed between the first and second pinned layers such that the first and second pinned layers establish a super-exchange interaction in an anti-parallel manner. The second pinned layer has a magnetic moment smaller than a magnetic moment of the first pinned layer.

12 Claims, 13 Drawing Sheets

FIG.7A

| $\theta_{pin(-)}$ [deg.] | $t_{pin1}$ [Å] | | | | | |
|---|---|---|---|---|---|---|
| | 20 | | 15 | | 10 | |
| $t_{pin2}$ [Å] | 25 | 82.2 | 84.5 | 87.6 | 84.6 | | |
| | 20 | | | 86.8 | 82.9 | 86.7 | 81.2 |
| | 15 | | | 88.5 | 75.1 | 84.1 | 79.2 |

FIG.7B

| $H_{ua}^{*}$ [$O_e$] | $t_{pin1}$ [Å] | | | | | |
|---|---|---|---|---|---|---|
| | 20 | | 15 | | 10 | |
| $t_{pin2}$ [Å] | 25 | 1325 | 1348 | 991 | 1004 | | |
| | 20 | | | 1547 | 1540 | 842 | 949 |
| | 15 | | | 2608 | 2363 | 1805 | 1756 |

FIG.7C

| MR RATIO [%] | $t_{pin1}$ [Å] | | | | | |
|---|---|---|---|---|---|---|
| | 20 | | 15 | | 10 | |
| $t_{pin2}$ [Å] | 25 | 7.2 | 6.0 | 7.4 | 6.8 | | |
| | 20 | | | 7.3 | 6.2 | 7.3 | 6.9 |
| | 15 | | | 6.5 | 4.7 | 6.8 | 6.1 |

WHERE Ta50/NiFe20/CoFeB15/Cu30/CoFeB$t_{pin2}$/Ru8/CoFeB$t_{pin1}$/PdPtMn150/Ta60

3.0 kOe

100 Oe

SPIN-VALVE MAGNETORESISTIVE SENSOR AND MAGNETIC HEAD HAVING SUCH A SPIN-VALVE MAGNETORESISTIVE SENSOR

BACKGROUND OF THE INVENTION

1. Field of the Invention

The present invention generally relates to magnetic storage of information, and particularly to a spin-valve magnetoresistive sensor and a magnetic head having such a spin-valve magnetoresistive sensor.

2. Description of the Related Art

Presently, anisotropic magnetoresistive (AMR) sensors are used extensively for a magnetic head of a hard disk drive (HDD) apparatus. Due to the tendency of increasing recording density of magnetic recording apparatuses, there is a growing need for a magnetic head having a spin-valve magnetoresistive sensor, which provides a sensitivity superior to an AMR sensor.

FIG. 1 is a partially cut-away perspective diagram of a composite magnetic head 130 including the spin-valve magnetoresistive head 100 of the related art. The composite magnetic head 130 incorporates the spin-valve magnetoresistive head 100 as a reading (reproducing) head of the hard disk drive apparatus and also incorporates a writing (recording) head. FIG. 1 also shows a hard disk 27 as a recording medium. In the figure, the hard disk 27 is arranged so as to oppose the composite magnetic head 130. The basic structure of the composite magnetic head 130 is substantially the same as the structure of the composite magnetic head 30 of the present invention. Therefore, further detailed description is omitted here. The structure of the composite magnetic head 130 of the related art can be understood when reading the detailed description of FIG. 8 by replacing the spin-valve magnetoresistive head 10 with the spin-valve magnetoresistive head 100 of the related art.

FIG. 2 is a partially cut-away perspective view showing a spin-valve magnetoresistive head 100 using a spin-valve magnetoresistive sensor of the related art. Further, FIG. 3 is a side view showing the spin-valve magnetoresistive head 100 of FIG. 2. In the following, the spin-valve magnetoresistive head 100 will be described in detail with reference to FIGS. 2 and 3.

The spin-valve magnetoresistive head 100 includes a lowermost underlayer 111 of tantalum (Ta) and an uppermost capping layer 116 also of Ta, and a spin-valve magnetoresistive sensor is interposed between the underlayer 111 and the capping layer 116. The spin-valve magnetoresistive sensor (or film) includes a free layer 112 of a ferromagnetic material, a non-magnetic layer 113 of a non-magnetic conductive material such as copper (Cu), a pinned magnetic layer 114 of a ferromagnetic material such as a cobalt-iron-boron (CoFeB) alloy, and a pinning layer 115 of an anti-ferromagnetic material, which may be formed of an ordered alloy made of palladium-platinum-manganese (PdPtMn), in the state that the layers 112–115 are stacked consecutively on the underlayer 111. The free layer 112 typically includes a first ferromagnetic layer 112a of nickel-iron (NiFe) provided on the underlayer 111 and a second ferromagnetic layer 112b of a cobalt-iron-boron (CoFeB) alloy provided on the first ferromagnetic layer 112a.

In this context, the ordered alloy used for the pinning layer 115 is understood as an anti-ferromagnetic alloy which does not exhibit magnetism when initially formed as the anti-ferromagnetic layer 115. On the other hand, the ordered alloy exhibits a stable magnetization when its magnetization is aligned as a result of magnetizing process conducted under a suitable condition.

The above-described spin-valve magnetoresistive head is manufactured first by providing the underlayer and then providing other layers described above in the order shown in FIGS. 2 and 3. Then, all the layers including the spin-valve magnetoresistive sensor are patterned to form a rectangular body, and electrode terminals 117a, 117b of a metal such as gold (Au) are provided on the uppermost capping layer 116 with a mutual separation from each other.

In the spin-valve magnetoresistive head 100 of FIG. 3, the area between the electrodes 117a and 117b and designated as S serves as the signal sensing area of the spin-valve magnetoresistive sensor. In the following text, X-, Y-, and Z-directions are defined as follows in order to make a clear explanation of, for example, the magnetizing direction of the spin-valve magnetoresistive sensor of the spin-valve magnetoresistive head 100. Thus, the Z-direction is defined as a direction of the thickness of the spin-valve magnetoresistive sensor. The Y-direction is a direction perpendicular to the Z-direction. It should be noted that the foregoing electrodes 117a and 117b are provided at the respective opposite ends of the rectangular body forming the spin-valve magnetoresistive sensor in the cross-sectional view taken in the Y-direction. The X-direction (the height) is a direction perpendicular to the Y-Z plane.

In the following text, it is assumed that the magnetization of the free layer 112 points in the Y-direction in the state where there is no external magnetic field applied to the free layer 112. In other words, the free layer 112 has an easy axis of magnetization pointing in the Y-direction. Also, a term "orientation" is understood to mean a predetermined direction, which may be shown by an arrow in the figures. A term "direction" can imply both opposite orientations having positive and negative signs.

During the operation of the spin-valve magnetoresistive head 100 of the related art, a sense current Is is caused to flow through the signal sensing region S between the two electrode terminals 117a, 117b, and the spin-valve magnetoresistive head 100 is caused to scan over a magnetic recording medium (not shown) such as a magnetic disk. Then, the electric resistance of the spin-valve magnetoresistive sensor changes in response to a signal magnetic field Hsig originating from the magnetic recording medium in the X-direction. Thus, the signal magnetic field of the magnetic recording medium can be detected as a change of the voltage appearing across the electrodes 117a and 117b.

With such a spin-valve magnetoresistive head 100, it is preferable that the resistance of the spin-valve magnetoresistive sensor changes linearly with respect to direction of the signal magnetic field Hsig such that the resistance increases when the signal magnetic field Hsig has a first orientation and such that the resistance decreases when the signal magnetic field Hsig has a second, opposite orientation It should be noted that the resistance of the spin-valve magnetoresistive sensor becomes minimum when the magnetization Mf of the free layer 112 and the magnetization Mp of the pinned magnetic layer 114 are parallel and becomes maximum when the magnetization Mf of the layer 112 and the magnetization Mp of the layer 114 are anti-parallel. In order to achieve this, the direction of magnetization Mp of the pinned magnetic layer 114 is pinned in the X-direction by establishing an exchange coupling between the pinned magnetic layer 114 and the anti-ferromagnetic layer 115. Then, when the signal magnetic field Hsig is zero, the direction of magnetization Mf of the free layer 112 points in the Y-direction as stated above.

Now, due to the increase in the recording density of the information recorded on a recording medium such as a hard disk, there is a tendency that the size of the individual magnetic spots formed on the magnetic disk becomes smaller and smaller, and because of this, the signal magnetic field Hsig which the spin-valve magnetoresistive head 100 is supposed to pick up tends to become very weak. In order to compensate for the weakening of the signal magnetic field Hsig, it is necessary to increase the magnetic resistance ratio (MR-ratio) $\Delta \rho/\rho$ to obtain a larger signal or S/N ratio. In order to achieve this, either the thickness (Z-direction) or the height of the sensor (X-direction) of the spin-valve magnetoresistive sensor has to be reduced.

Firstly, a process of reducing the thickness (Z-direction) is considered. The layer having the greatest thickness in the spin-valve magnetoresistive sensor is the anti-ferromagnetic layer 115, which generally requires a thickness of more than 200 Å. If the thickness of the anti-ferromagnetic layer 115 is less than 100 Å, the exchange coupling magnetic field for fixing the orientation of magnetization Mp of the pinned magnetic layer 114 works little. Thus, there is a risk that the direction of magnetization Mp may be reversed easily by a disturbance such as an externally applied heat. Further, in view of maintaining the magnetic proper necessary for the spin-valve magnetoresistive sensor, each of the pinned magnetic layer 114 and the free layer 112 has to have a sufficient thickness. Therefore, there is a limitation in reducing the thickness of the pinned magnetic layer 114 or the thickness of the free layer. 112.

Secondly, a process of reducing the height of the sensor (X-direction) is considered.

Technically, it is possible to reduce the height of the layers. However, when the height of the sensor becomes too small, the distance between the side edges of the pinned magnetic layer 114 extending in the Y-direction becomes so small that the effect of so-called counteracting magnetic field becomes predominant. Then, the magnetic state of the pinned magnetic layer 114 becomes unstable and there arises a problem that the detection of the magnetic field becomes unstable.

Recently, in order to solve the problem related to counteracting-magnetic field, a spin-valve magnetoresistive sensor is proposed in which the pinned magnetic layer includes a first pinned magnetic layer, a second pinned magnetic layer, and an intermediate layer provided between the first and second pinned magnetic layers. However, with such a structure, a disordered metal of, for example, NiO is used as an anti-ferromagnetic layer. Therefore, the anti-ferromagnetic layer already exhibits a magnetic property at an instant when the pinned magnetic layer is stacked thereon. Accordingly, there are many problems in manufacturing a spin-valve magnetoresistive sensor while maintaining the above-described preferable relationship between the pinned magnetic layer and the free layer.

As has been described above, there are many problems related to development of the spin-valve magnetoresistive sensor. The present invention is related to a method in which the height of the sensor (X-direction) is reduced. More specifically, the present invention relates to a structure including a pinned magnetic layer having a first pinned magnetic layer, a second pinned magnetic layer, and an intermediate layer provided between the first and second pinned magnetic layers. Also, an alloy used for the anti-ferromagnetic layer in the present invention does not exhibit a magnetic property when initially produced as an anti-ferromagnetic layer, but will exhibit the magnetic property when its structure is aligned according to a magnetizing process under a certain condition.

The ordered alloy used for the anti-ferromagnetic layer does not exhibit a magnetic property directly after production of the spin-valve magnetoresistive sensor. The alloy is anti-ferromagnetized (aligned) after implementing a heat treatment in a magnetic field. Thus, the magnetization of the pinned magnetic layer can be fixed. The ordered alloy exhibits such a property due to the fact that the metal crystals will be aligned in a predetermined direction and thus undergoes a phase change from a face-centered cubic structure (fcc) to a face-centered tetragonal structure (fct).

With the spin-valve magnetoresistive sensor of the related art, since the magnetization of the pinned magnetic layer is fixed after the layers have been produced, the heat treatment is implemented while applying a magnetic field of over 2500 Oe (Oersted) in the X-direction. Then, in order to strengthen a magnetic anisotropic property of the free layer, a heat treatment is implemented while applying a predetermined magnetic field in the Y-direction.

However, when a magnetization process similar to that of the related art is implemented on a structure having pinned magnetic layer including a first pinned magnetic layer, a second pinned magnetic layer, and an intermediate layer provided between the first and second pinned magnetic layers, there arises a problem that the orientation of magnetization of the pinned magnetic layer deflects from the X-direction and inclines in the Y-direction. The orientation of magnetization of the pinned magnetic layer and the orientation of magnetization of the free magnetization layer are ideally mutually perpendicular, but an inclination of ±20 degrees from a right angle is allowable. However, with an inclination exceeding ±20 degrees, a linear output response cannot be achieved with respect to the input of an external signal magnetic field Hsig. Accordingly, there is a problem that a reproduction waveform of the output voltage is deformed.

SUMMARY OF THE INVENTION

Accordingly, it is a general object of the present invention to provide a spin-valve magnetoresistive sensor which can solve the above-described problems.

It is another and more specific object of the present invention to provide a spin-valve magnetoresistive sensor which can control the problems related to antimagnetic field and can solve the problems of the related art.

In order to achieve the above objects according to the present invention, a spin-valve magnetoresistive sensor includes:

a free layer of a ferromagnetic material;

a non-magnetic layer provided on the free layer;

a pinned layer provided on the non-magnetic layer; and a pinning layer of an anti-ferromagnetic material provided on the pinned layer, the anti-ferromagnetic material being an ordered alloy containing manganese.

The pinned layer includes:

a first pinned layer of a ferromagnetic material;

a second pinned layer of a ferromagnetic material provided on the first pinned layer; and an intermediate layer interposed between the first and second pinned layers such that the first and second pinned layers establish a super-exchange interaction in an anti-parallel manner.

The second pinned layer has a magnetic moment smaller than a magnetic moment of the first pinned layer.

With the spin-valve magnetoresistive sensor described above, by using an ordered alloy including manganese as an anti-ferromagnetic layer, a preferable relationship between the above-described pinned magnetic layer and the free layer can be easily achieved. Accordingly, with a multilayered pinned magnetic layer, the spin-valve magnetoresistive sensor can be further miniaturized and thus can achieve a thin-film structure of reduced thickness.

It is still another object of the present invention to provide a method of manufacturing a spin-valve magnetoresistive sensor of the above-described type.

In order to achieve the above object, a method of manufacturing a spin-valve magnetoresistive sensor includes the steps of:

a) forming a multilayered body in an order of the free layer, the non-magnetic layer, the first pinned layer, the intermediate layer, the second pinned layer, and the anti-ferromagnetic layer;

b) implementing a first heat treatment within a magnetic field for regulating a magnetic state of the pinning layer and for fixing an orientation of magnetization of the first and second pinned layers; and c) implementing a second heat treatment within a magnetic field for regulating a magnetic anisotropic property of the free layer in an environment with a lower temperature and a weaker magnetic field than in the first heat treatment within the magnetic field.

It is yet another object of the present invention to provide a spin-valve magnetoresistive sensor in which a heat treatment in a magnetic field, which is similar to that of the double-layered pinned layer, can be applied to a single-layered pinned layer of the related art.

In order to achieve the above object, a magnetic head having a spin-valve magnetoresistive sensor includes:

a free layer provided on the non-magnetic layer, a non-magnetic layer provided on the free layer;

a pinned layer provided on the non-magnetic layer; and a pinning layer of an anti-ferromagnetic material provided on the pinned layer, the anti-ferromagnetic material being an ordered alloy containing manganese;

The direction of magnetization of the pinned magnetic layer and an easy axis of magnetization of the free layer are at a right angle or within ±20 degrees of the right angle. The pinned layer has an effective anisotropic magnetic field Hua of a magnitude of greater than or equal to about 600 Oe.

With the structure described above, the orientation Mf of the magnetization of the free layer rotates with respect to a signal magnetic field Hsig from an external magnetic recording medium. Thus, the resistance of the spin-valve magnetoresistive sensor can be changed linearly.

The present invention further relates to a magnetic head having the spin-valve magnetoresistive sensor described above and a magnetic recording medium drive apparatus having a magnetic head provided with a spin-valve magnetoresistive sensor.

Other objects and further features of the present invention will be apparent from the following detailed description when read in conjunction with the accompanying drawings.

BRIEF DESCRIPTION OF THE DRAWINGS

FIGS. 7A to 7C are diagrams showing charts of relationships between the first pinned magnetic layer 4c and the second pinned magnetic layer 4a.

DETAILED DESCRIPTION OF THE PREFERRED EMBODIMENTS

In the following, principles and embodiments of the present invention will be described with reference to the accompanying drawings.

Figure 4:
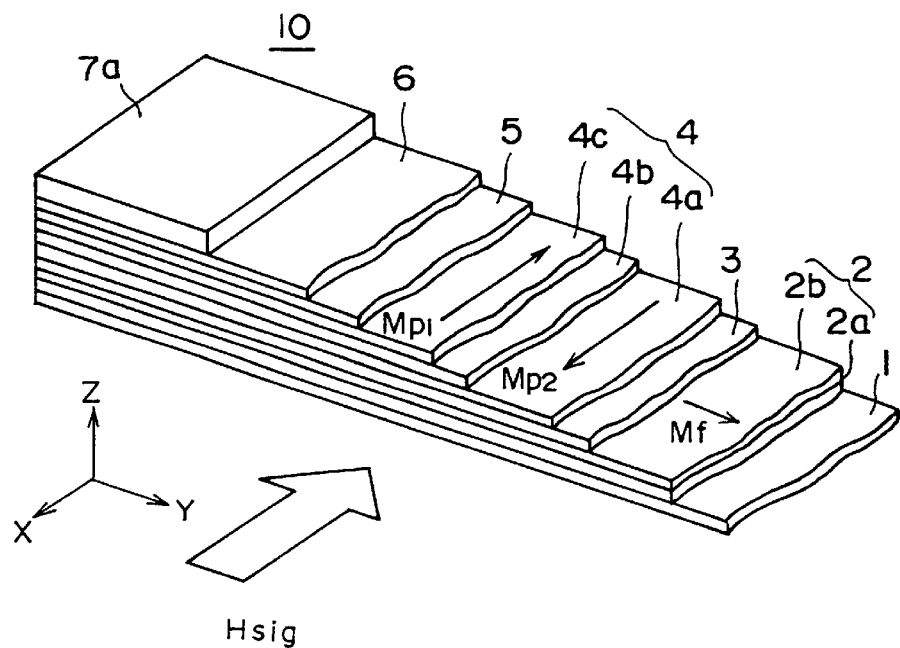
FIG. 4 is a partially cut-away perspective view showing a spin-valve magnetoresistive head using a spin-valve magnetoresistive sensor of an embodiment of the present invention.
Figure 5:
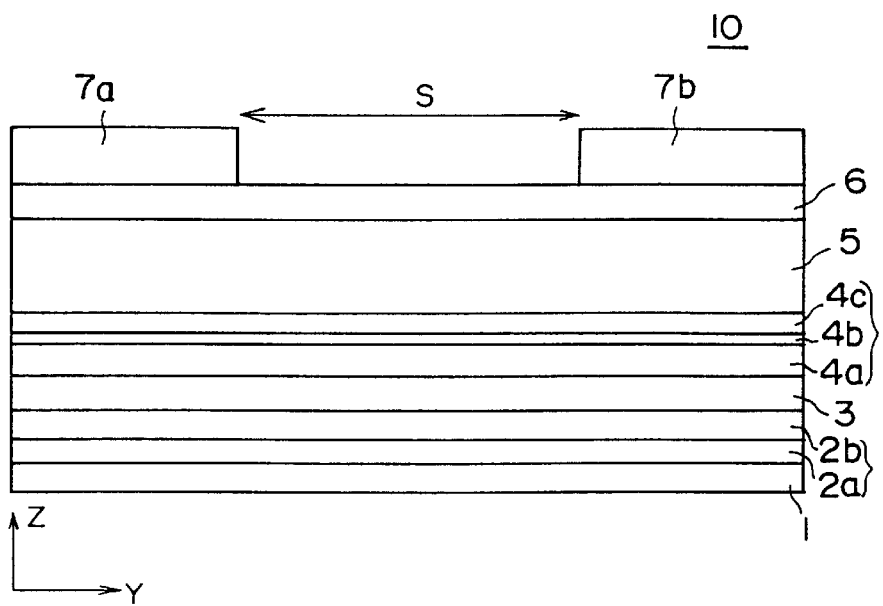
FIG. 5 is a side view showing the spin-valve magnetoresistive head of FIG. 4.

FIGS. 4 and 5 are diagrams showing a spin-valve magnetoresistive (spin-valve magnetoresistive) head 10 using a spin-valve magnetoresistive (spin-valve magnetoresistive) sensor of an embodiment of the present invention. The spin-valve magnetoresistive head 10 has a basic structure including an underlayer 1, a capping layer 6 and the spin-valve magnetoresistive sensor (film) interposed between the underlayer 1 and the capping layer 6.

The underlayer 1 is made of a material such as tantalum (Ta) having a thickness of about 50 Å. A free layer 2 including a first free layer 2b and a second free layer 2a is provided on the underlayer 1. The second free layer 2a is provided on the underlayer 1 and a first free layer 2b is provided on the second free layer 2a. The second free layer 2a is made of a material such as a nickel-iron (NiFe) alloy having a thickness of, for example, 20 Å. The first free layer 2b is made of a material such as a cobalt-iron (CoFe) alloy having a thickness of, for example, 15 Å, or a cobalt-iron-boron (CoFeB) alloy having a thickness of, for example, 15 Å. The first and second free layers 2b and 2a integrally form the free layer 2.

The reason for providing such a double-layered free layer 2 is to prevent Ni and Cu from causing mutual diffusion between the NiFe layer 2a and a non-magnetic metal layer 3 of Cu, which will be described later. In order to achieve this, a CoFe layer or a CoFeB layer, which does not dissolve with Cu, is interposed between the first and second free layers. Further, a sufficiently thick NiFe layer 2a having a relatively small coercive force may be provided underneath the CoFe or CoFeB layer 2b having a relatively large coercive force, so that the direction of magnetization of the free layer 2 can be changed easily. Thus, the free layer 2 can achieve its intended function.

It is to be noted that, in the drawings, the first free layer is shown as an upper layer and the second free layer is shown as a lower layer. However, the explanation is made in the order of stacking the layers, i.e., from the lower layer. Therefore, the order of explanation and the order of the reference numerals are opposite. This also applies for a pinned magnetic layer 4, which will be described later.

As shown in FIG. 4, the non-magnetic metal layer 3 is provided on the free layer 2. The non-magnetic metal layer 3 is made of a material such as Cu film having a thickness of about 30 Å. The pinned magnetic layer 4 is provided on the non-magnetic metal layer 3. The pinned magnetic layer 4 has a triple-layered structure including, from the bottom, a second pinned magnetic layer 4a, an intermediate layer 4b and a first pinned magnetic layer 4c. The intermediate layer 4b is provided for establishing a super-exchange reaction and thus coupling the first pinned magnetic layer 4c and the second pinned magnetic layer 4a in an anti-parallel manner.

The second pinned magnetic layer 4a is made of a material such as a cobalt-iron (CoFe) alloy or a cobalt-iron-boron (CoFeB) alloy having a thickness of, for example, 25 Å. The intermediate layer 4b made of a material such as ruthenium (Ru). The first pinned magnetic layer 4c is made of a material such as a cobalt-iron-boron (CoFeB) alloy having a thickness of, for example, 15 Å. These three layers integrally form a pinned magnetic layer 4.

The reason for providing such a triple-layered pinned magnetic layer 4 is to reduce an X-direction width, i.e., to reduce the height of the sensor, for high-density recording. A reduced height of the sensor of less than 0.5 μm will cause an increase of a counteracting magnetic field generated inside the pinned magnetic layer 4, which is normally magnetized in the height direction. Then, an inversion of magnetization will likely occur inside the pinned magnetic layer 4. Also, the magnetization at end edges of the free layer 2 will be affected, resulting in a distortion of a reproduction output.

The pinned magnetic layer 4 is provided as a layered structure having the second pinned magnetic layer 4a, the first pinned magnetic layer 4c and the intermediate layer 4b interposed between the first and second layers 4c and 4a. Such a structure achieves a stronger pinned magnetic layer. That is to say, by providing the intermediate layer 4b between the second pinned magnetic layer 4a and the first pinned magnetic layer 4c, the directions of magnetization of the second and the first pinned magnetic layers 4a and 4c will be mutually anti-parallel. Here, the term "anti-parallel" is understood to mean that the directions of magnetization are mutually parallel in opposite directions. The anti-parallel state may be caused by an electrostatic super-exchange coupling effect.

A thus-obtained bonding force is far greater than an exchange coupling force between an anti-ferromagnetic layer 5 described later and the triple-layered pinned magnetic layer 4. Therefore, the bonding force between the first and second static magnetic layers can maintain an anti-parallel state in a stable manner against a magnetic field of several thousand Oersteds (Oe). Therefore, with the intermediate layer 4b, the static magnetization of the pinned magnetic layer 4 as a whole becomes smaller. Thus, there will be less inversion of magnetization since the counteracting magnetic field is reduced and thus an effect on the free layer 2 is reduced. As a result, a reproduction characteristic of the spin-valve magnetoresistive sensor, as a whole, is improved.

Further, the spin-valve magnetoresistive sensor of the present invention is constructed such that a magnetic moment of the first pinned magnetic layer 4c is smaller than a magnetic moment of the second pinned magnetic layer 4a. When the first and second pinned magnetic layers are made of substantially same magnetic materials, the thickness of the first pinned magnetic layer 4c will be made smaller than the thickness of the second pinned magnetic layer 4a. If the thickness of the second pinned magnetic layer 4a is 25 Å, the thickness of the first pinned magnetic layer 4c will be less than 25 Å, for example, 15 Å. In the present embodiment, the second pinned magnetic layer 4a made of a material such as a cobalt-iron (CoFe) alloy or a cobalt-iron-boron (CoFeB) alloy of approximately 25 Å and the first pinned magnetic layer 4c is made of a material such as a cobalt-iron-boron (CoFeB) alloy of approximately 15 Å.

Referring to a graph shown in FIG. 6, the relationship between the first and second pinned magnetic layers 4c, 4a will be described in detail.

Figure 6:
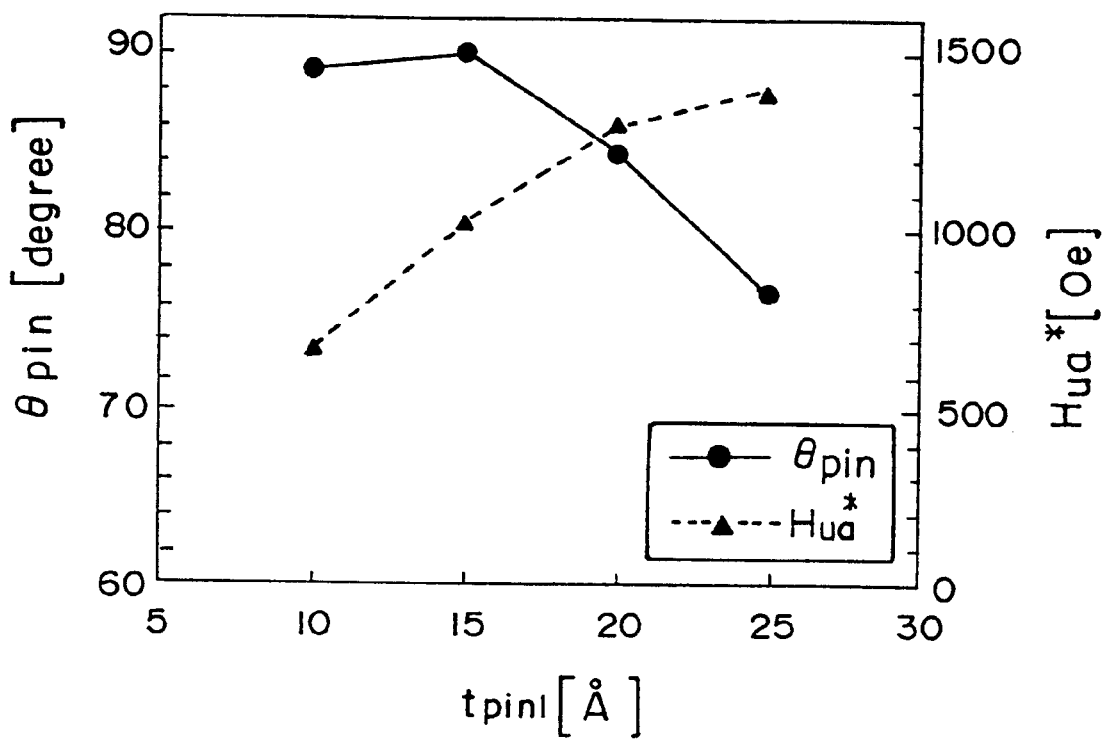
FIG. 6 is a diagram showing a graph of magnetization angle θpin and effective anisotropic magnetic field Hua against a thickness of a first pinned magnetic layer 4c, with a thickness of a second pinned magnetic layer 4a being fixed at 25 Å.

The graph of FIG. 6 shows a case where the second pinned magnetic layer 4a has a thickness fixed at 25 Å. A magnetization angle θpin is taken along a left vertical axis and an effective anisotropic magnetic field Hua (Oe) is taken along a right vertical axis with a thickness tpin (Å) of the first pinned magnetic layer 4c along the horizontal axis. In the graph shown in FIG. 6, the thickness tpin (Å) of the first pinned magnetic layer 4c takes the values of 10, 15, 20, 25.

The magnetization angle θpin is an angle formed between a direction of orientation of magnetization of the pinned magnetic field 4 and a direction of easy axis of magnetization showing anisotropy of the free layer 2, i.e., the Y-direction. As has been described above, the magnetization angle θpin is ideally 90 degrees, i.e., at right angles, when there is no external magnetic field. In use, an inclination of ±20 degrees offset from right angle is allowable. That is to say, it is required that the magnetization angle θpin is greater than 70 degrees.

The effective anisotropic magnetic field Hua represents the magnetic stability of the static magnetic field and is required to have a value of greater than or equal to about 600 Oe. The spin-valve magnetoresistive sensor of the present invention satisfies the requirements described above.

As shown in FIG. 6, the magnetization angle θpin will increases as the thickness tpin of the second pinned magnetic layer 4c is reduced. The magnetization angle θpin is at its ideal value, i.e., 90 degrees, when the thickness tpin equals 15 Å (tpin=15 Å). On the contrary, the effective anisotropic magnetic field Hua will decrease as the thickness tpin of the second pinned magnetic layer 4c is reduced. Therefore, there is a problem that the magnetization may be reversed. Therefore, when the thickness of the second pinned magnetic layer 4a is fixed at 25 Å, the thickness tpin of the second pinned magnetic layer 4c is allowable between 10 to 20 Å. Also, it can be seen that the difference of the thicknesses is preferably 5 to 10 Å.

Referring to FIGS. 7A to 7C, the relationship between the first pinned magnetic layer 4c and the second pinned magnetic layer 4a will be described. FIG. 7A is a diagram showing such a relationship with respect to the magnetization angle θpin. FIG. 7B is a diagram showing such a relationship with respect to the effective anisotropic magnetic field Hua. FIG. 7C is a diagram showing such a relationship with respect to the magnetic resistance ratio (MR-ratio).

Each of the charts shown in FIGS. 7A to 7C has columns tpin1 taking the values of the thickness of the first pinned magnetic layer 4c and rows tpin2 taking the values of the thickness of the second pinned magnetic layer 4a. In FIGS. 7A to 7C, the thickness tpin1 takes the values of 10, 15, 20 (Å) and the thickness tpin2 takes the values of 15, 20, 25 (Å). It is required that the magnetization angle θpin is substantially 90 degrees, the effective anisotropic magnetic field Hua is more than 600 Oe, and the magnetic resistance ratio (MR-ratio) is about 7%. In order to satisfy the requirements described above, referring to FIGS. 7A to 7C, it can be seen that the difference between the thickness of the first pinned magnetic layer 4c and the thickness of the second pinned magnetic layer 4a should be greater than 5 Å.

Referring again to FIGS. 4 and 5, the spin-valve magnetoresistive head 10 is provided with the anti-ferromagnetic layer 5 of an ordered alloy, which is overlaid on the pinned magnetic layer 4. The capping layer 6 is provided on the anti-ferromagnetic layer 5. Further, a pair of electrode terminals 7a, 7b are provided with a mutual separation from each other on the capping layer 6.

The anti-ferromagnetic layer 5 is provided for fixing the direction of magnetization of the first pinned magnetic layer 4c. Also, as has been described above, the direction of magnetization of the second pinned magnetic layer 4b is fixed in an anti-parallel direction with respect to the first pinned magnetic layer 4c via the ferromagnetic coupling intermediate layer 4b.

The anti-ferromagnetic layer 5 is made of a material having a comparatively large exchange coupling magnetic field, a high blocking temperature and a good corrosion resistance. Such a material may be chosen from a group of ordered alloys including, for example, palladium-platinum-manganese (PdPtMn), platinum-manganese (PtMn), palladium-manganese (PdMn), nickel-manganese (NiMn), and chromium-manganese (CrMn). The film made of such an alloy has good corrosion resistance since a metal of a platinum type such as palladium and platinum is used. The most preferable ordered alloy is palladium-platinum-manganese (PdPtMn). Also, the thickness of the layer is, for example, greater than or equal to about 100 Å, and preferably about 150 Å. There is a great achievement in reducing the thickness compared to the anti-ferromagnetic layer of the related art.

Also, the capping layer 6 is made of a material such as tantalum and has a thickness of about 60 Å. The electrode terminals 7a, 7b are made of a conductive material, which may be a gold layer having a thickness of about 1000 Å.

Referring again to FIG. 4, an operation of the spin-valve magnetoresistive head 100 having the above-described spin-valve magnetoresistive sensor will be described. As has been described above, the spin-valve magnetoresistive sensor is basically made of four layers. The orientation of magnetization of the first pinned magnetic layer 4c adjacent to the anti-ferromagnetic layer 5 is fixed in the X-direction shown by an arrow Mp1. The orientation of magnetization of the second pinned magnetic layer 4a is fixed in the X-direction shown by an arrow Mp2, which is opposite to Mp1. The orientations of magnetization of the first pinned magnetic layer 4c and the second pinned magnetic layer 4a are magnetically coupled via the intermediate layer 4b in an anti-parallel manner. Thus, in order to change these orientations, a considerably great external magnetic field is required.

On the contrary, the orientation of magnetization Mf of the free layer 2 can be easily rotated when a weak external magnetic field (e.g., signal magnetic field Hsig) is applied. When there is no external magnetic field, the orientation of magnetization Mf will be directed to the easy magnetization axis of magnetization (Y-direction) due to the anisotropic property of the free layer 2 itself.

The orientation of magnetization of the free layer 2 rotates in response to the external magnetic field Hsig of the spin-valve magnetoresistive head 10. Then, the magnetic resistance within the spin-valve magnetoresistive sensor changes due to the difference between the orientations of magnetization of the second pinned magnetic layer 4a and the free layer 2. In other words, the change of resistance between the electrode terminals 7a, 7b is proportional to the cosine (cos θ) of an angle θ between orientations of magnetization of the second pinned magnetic layer 4a and the free layer 2.

A maximum resistance is obtained when the orientations of magnetization of the second pinned magnetic layer 4a and the free layer 2 are opposite, i.e., the angle θ equals 180 degrees. This is due to an increase of the probability of scattering at boundary surfaces of the free layer 2, the non-magnetic metal layer 3, and the second pinned magnetic layer 4a. This scattering is caused when electrons in one of the first magnetic layer 2 and the second pinned layer 4a move to the other one of the layers. On the contrary, when the orientations of magnetization of both layers are the same, i.e., the angle θ equals 0 degrees, a minimum resistance is obtained since the probability of scattering at the boundary surfaces will be minimum.

Figure 8:
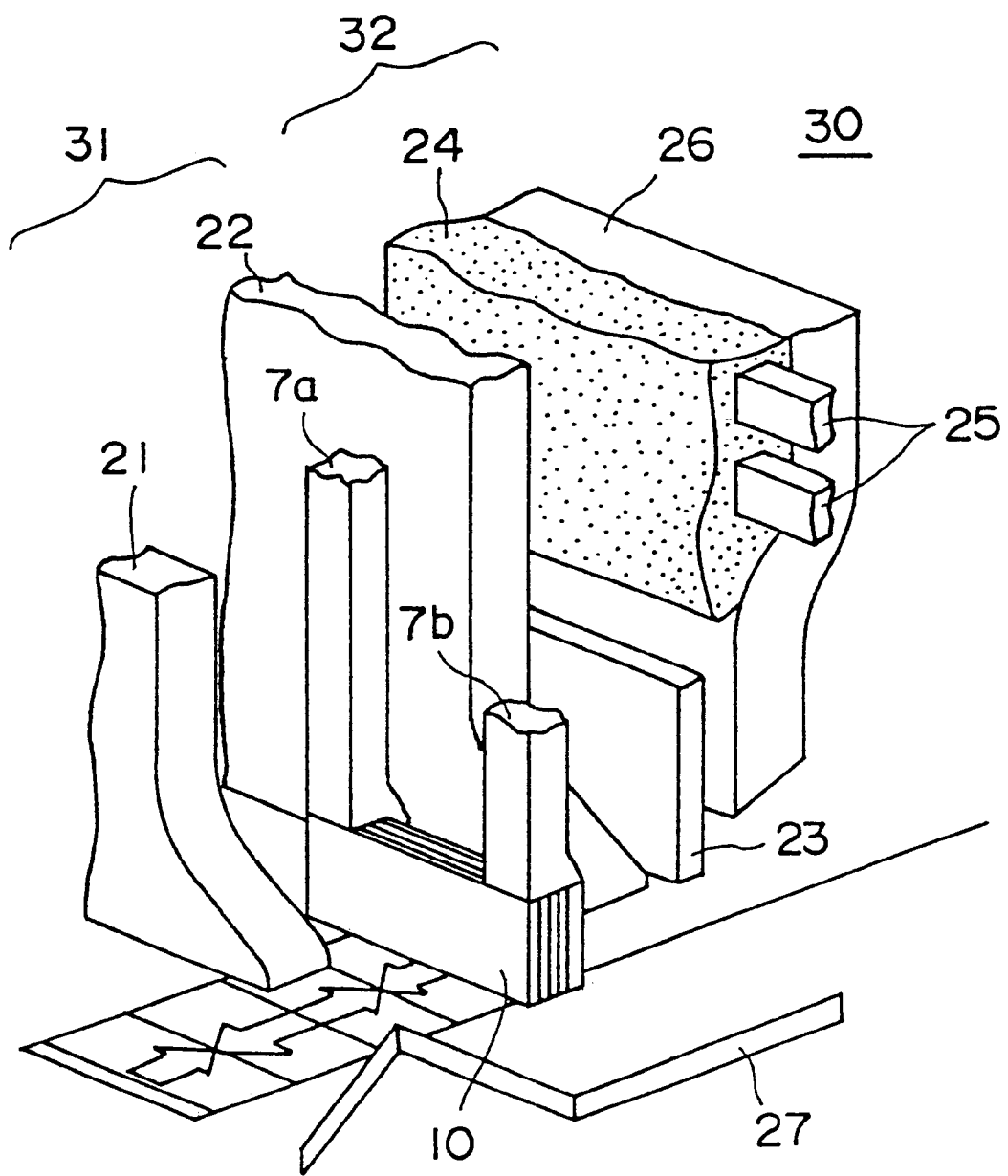
FIG. 8 is a partially cut-away perspective diagram of a composite magnetic head including the spin-valve magnetoresistive sensor of the present invention.

FIG. 8 is a partially cut-away perspective diagram of a composite magnetic head 30 including the spin-valve magnetoresistive sensor of the present invention. The composite magnetic head 30 incorporates the spin-valve magnetoresistive head 10 as a reading (reproducing) head of the hard disk drive apparatus and also incorporates a writing (recording) head. FIG. 8 also shows a hard disk 27 as a recording medium. In the figure, the hard disk 27 is arranged so as to oppose the composite magnetic head 30.

The spin-valve magnetoresistive head 10 is used as a reading head 31 of the composite magnetic head 30. Generally, the composite magnetic head 30 includes the reading head 31 and the writing head 32. The composite magnetic head 30 is of a merged type in which the reading head 31 has an upper shield 22 which also serves as a lower magnetic pole (lower core) of the writing head 32. Also, the composite magnetic head 30 is constructed as a piggy-back structure with the writing head 32 being added on the back of the reading head 31.

That is to say, as shown in FIG. 8, the reading head 31 includes the spin-valve magnetoresistive sensor 10 and the electrode terminals 7a and 7b provided with a mutual separation from each other on the spin-valve magnetoresistive sensor 10. The spin-valve magnetoresistive sensor 10 and the electrode terminals 7a, 7b are arranged between the lower shield 21 and an upper shield 22 of the reading head 31.

The writing head 32 includes a writing coil 25 and an organic insulating layer 24 surrounding the writing coil 25. The organic insulating layer 24 and a magnetic gap layer 23 are arranged between the lower magnetic pole 22 and an upper magnetic pole 26 of the writing head 32. That is to say, the upper shield 22 of the reading head 31 is also used as the lower magnetic pole of the writing head 32. The lower magnetic pole 22 of the writing head 32 is fixed to the upper magnetic pole 26 of the writing head 32 opposing thereto, with the organic insulating layer 24 and the magnetic gap layer 23 being arranged between the lower and upper magnetic poles 22 and 26. The writing coil 25 is embedded in the organic insulating layer 24. Thus, the reading head 31 and the writing head 32 are integrated as the composite magnetic head 30.

Figure 9:
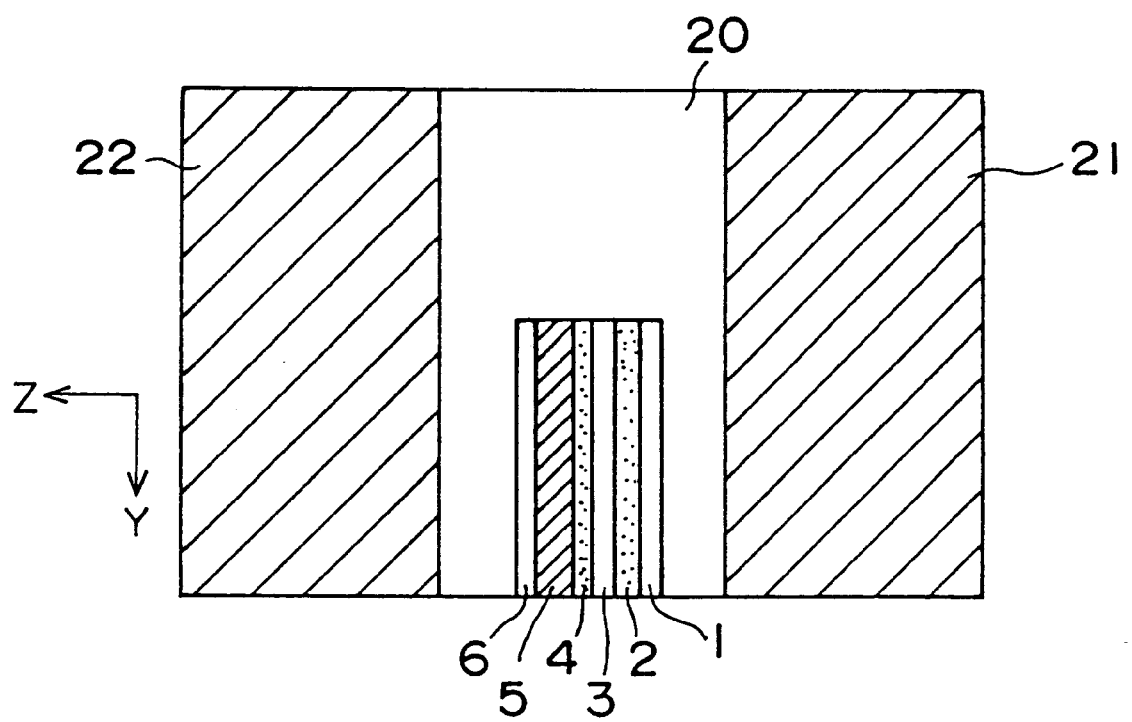
FIG. 9 is a schematic diagram of the reading head viewed from a side opposing a recording medium.

FIG. 9 is a schematic diagram of the reading head viewed from a side opposing a recording medium. A gap insulating layer 20 is provided between the lower and upper shields 21 and 22 of the reading head 31. The gap insulating layer 20 is provided with an opening in which the spin-valve magnetoresistive sensor of the present invention may be accommodated.

Figure 10:
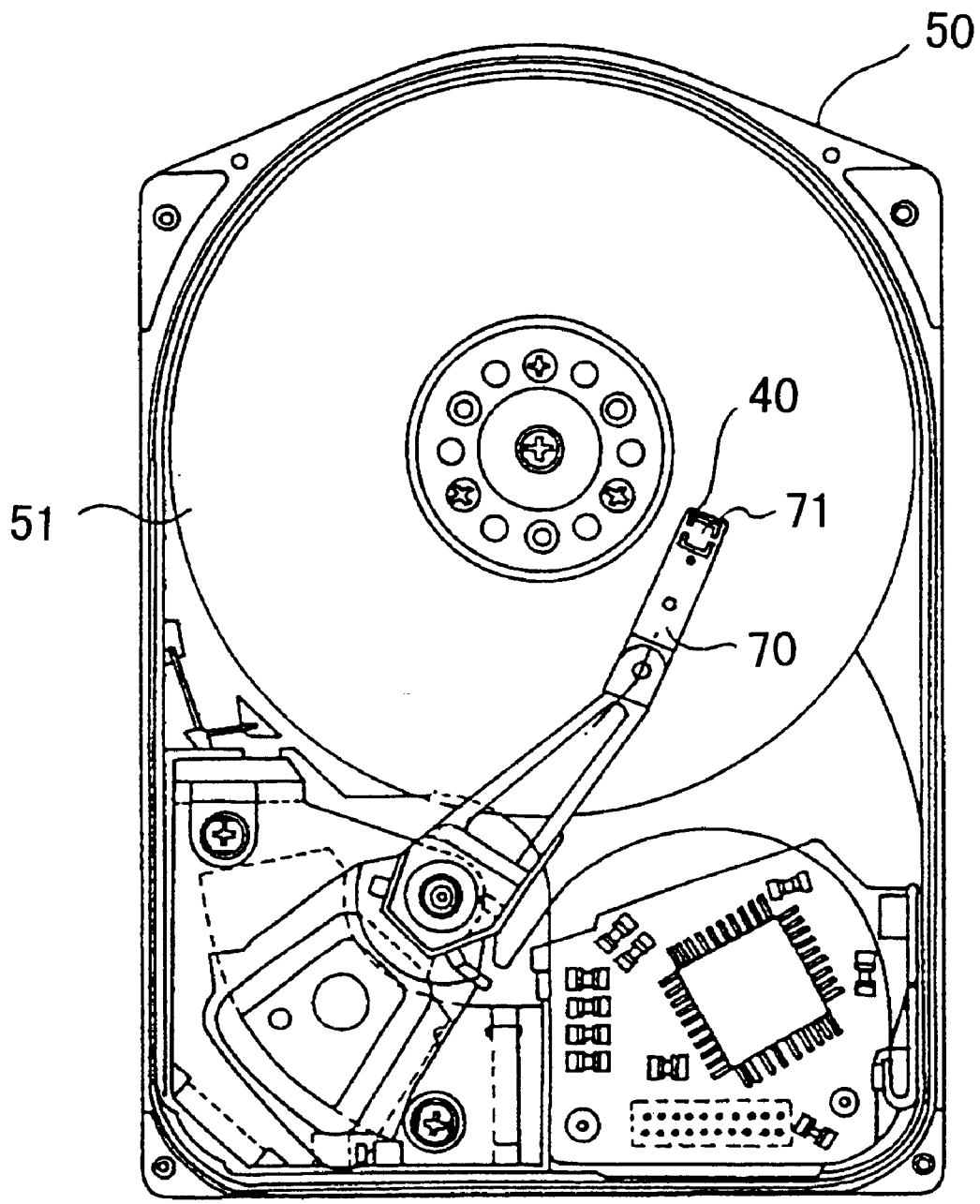
FIG. 10 is a plan view showing a magnetic recording medium drive apparatus having a reading head including the spin-valve magnetoresistive sensor of the present invention.

FIG. 10 is a plan view showing a magnetic recording medium drive apparatus 50 having a reading head including the spin-valve magnetoresistive sensor 10 of the present invention. FIG. 10 shows major parts of the magnetic recording medium drive apparatus 50. A hard disk 51 is mounted in the magnetic recording medium drive apparatus 50 as a magnetic recording medium. The hard disk can be driven in a rotational manner. The magnetic reading operation is carried out by a composite magnetic head 40 having the spin-valve magnetoresistive sensor 1. The composite magnetic head 40 is held against the reading side with a predetermined gap between the composite magnetic head 40 and the surface of the hard disk 51. Also, the composite magnetic head 40 is fixed at the front edge part of a slider 71 provided at the free end of an arm 70. The positioning of the composite magnetic head 40 can be implemented by means of a two-stage actuator having a normal actuator and an electromagnetic precision actuator.

Now, a manufacturing process of the composite magnetic head 30 will be described with reference to FIG. 11.

Firstly, the lower shield layer 21 of the reading head is formed in step S40. The lower shield layer 21 is made of a material such as nitrogen-iron (N-Fe).

A lower gap insulating layer of the reading head is formed in step S41. The lower gap insulating layer of the reading head is made of a material such as aluminum oxide ($Al_2O_3$).

In step S42, the layers of the spin-valve magnetoresistive sensor 10 shown in FIG. 4 are formed and then patterned. Then, the electrode terminals 7a, 7b are formed on the layers of the spin-valve magnetoresistive sensor 10. In other words, the spin-valve magnetoresistive sensor 10 includes the free layer 2, the non-magnetic metal layer 3, the multilayered pinned magnetic layer 4 and the anti-ferromagnetic layer 5, and the capping layer 6, which are stacked on the underlayer by sputtering. The spin-valve magnetoresistive sensor 10 is then patterned into a flat rectangular shape by photolithography. Then, the pair of electrode terminals 7a, 7b is formed with a mutual separation from each other on the uppermost capping layer 6.

An upper gap insulating layer of the reading head is formed in step S43. The upper gap insulating layer of the reading head is made of a material such as aluminum oxide ($Al_2O_3$).

An upper shield 22 of the reading head is formed in step S44. The upper shield 22 of the reading head is made of a material such as nickel-iron (NiFe).

A gap layer of the writing head is formed in step S45. The recording coil 25 is formed in step S46. The upper recording magnetic pole 26 is formed in step S47. A protection layer is formed in step S48.

Figure 11:
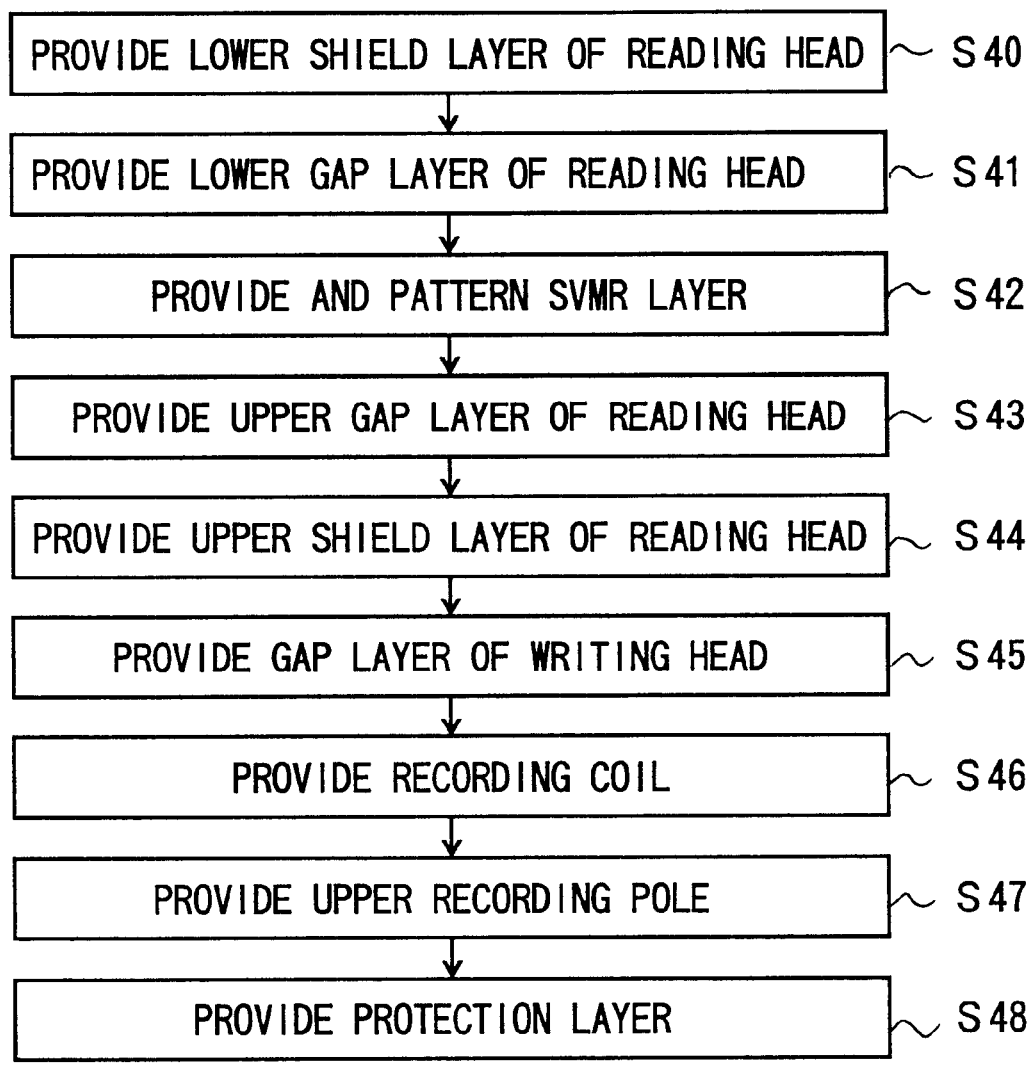
FIG. 11 is a block diagram showing a manufacturing process of the composite magnetic head.
Figure 12:
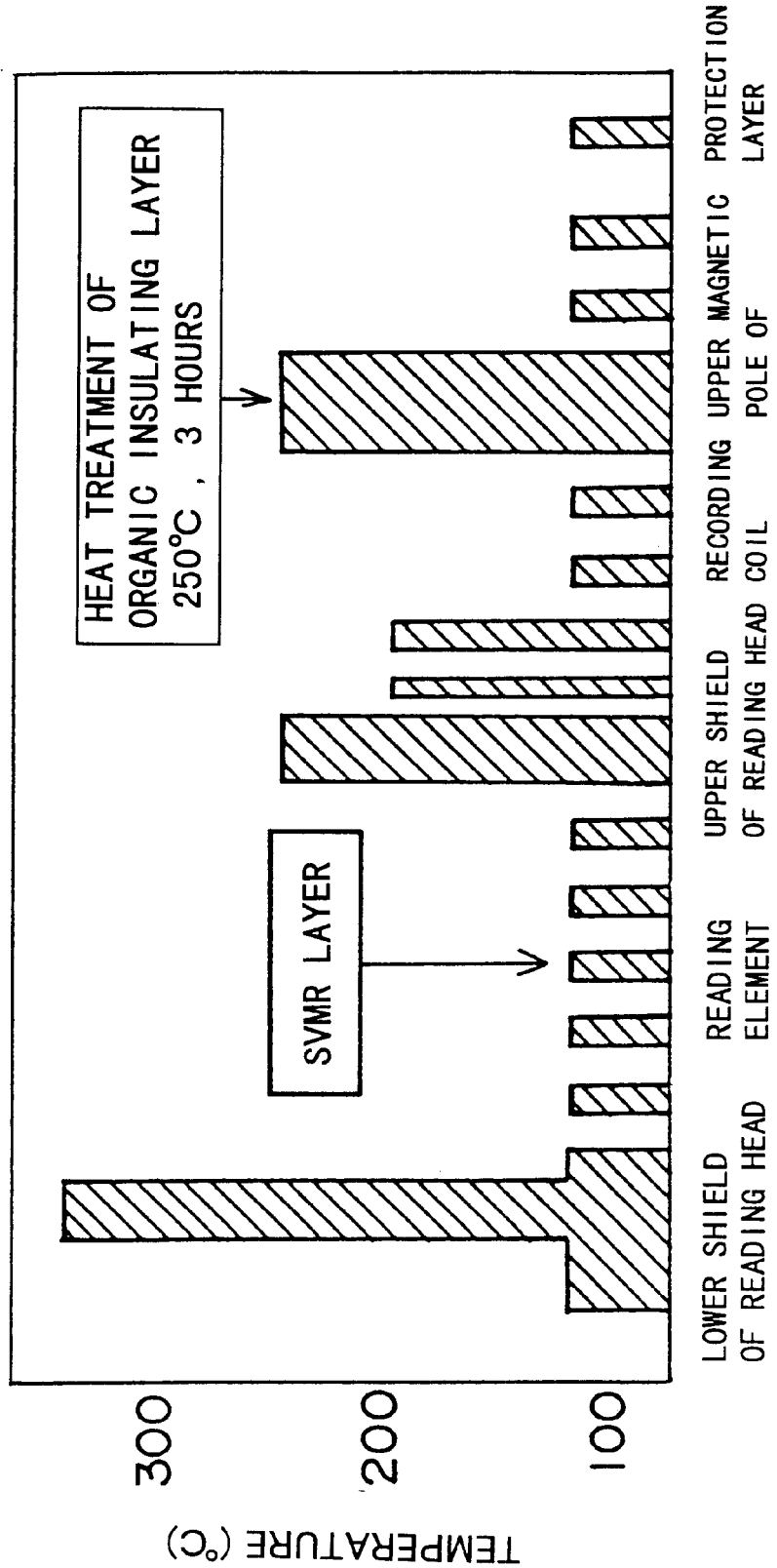
FIG. 12 is a chart showing processing temperature for each step of the manufacturing process shown in FIG. 11.

FIG. 12 is a chart showing a processing temperature for each step of the manufacturing process shown in FIG. 11. In FIG. 12, the steps of the manufacturing processes are indicated along the horizontal axis and the processing temperature is indicated on the vertical axis. After forming the spin-valve magnetoresistive sensor, a step including a heat treatment with a high temperature is implemented. The heat treatment may affect the characteristics of the magnetic resistance effect of the spin-valve magnetoresistive sensor. Such a step including heat treatment is, for example, a step of implementing a heat treatment on an organic insulating layer. The aim of the heat treatment of the organic insulating layer is, for example, to cure the organic insulating layer filled around the recording coil 25. Generally, this step includes a heat treatment at a temperature over 250° C. for three hours.

In order to manufacture the spin-valve magnetoresistive sensor of the present invention, it is necessary that the orientations of magnetization of the first and second pinned magnetic layers 4c and 4a of the pinned magnetic layer 4 are fixed in the X-directions with opposite orientations. Also, the orientations of magnetization of the first and second pinned magnetic layers 4c and 4a should be kept orthogonal to the easy axis of magnetization (Y-direction) of the free layer 2. This will be described below.

After forming the layers of the spin-valve magnetoresistive sensor as has been described above, a first heat treatment within a magnetic field is implemented. The purpose of the first heat treatment is to fix the orientations of magnetization of the second and first pinned magnetic layers 4a and 4c in the X-direction opposite to each other ("positive X-direction" and "negative X-direction"). During the first heat treatment within the magnetic field, the spin-valve magnetoresistive sensor (film) undergoes a heat treatment at 280° C. for three hours with the magnetic field of about 100 Oe in the negative X-direction applied by means of a direct-current magnetic-field generating source.

Further, a second heat treatment within a magnetic field is implemented so as to strengthen the magnetic anisotropic property of the free layer 2 in the Y-direction. During the second heat treatment within the magnetic field, the spin-valve magnetoresistive sensor (film) undergoes a heat treatment at 230° C. for three hours with the magnetic field of less than 100 Oe in the Y-direction applied by means of a direct-current magnetic-field generating source.

Figure 13A:
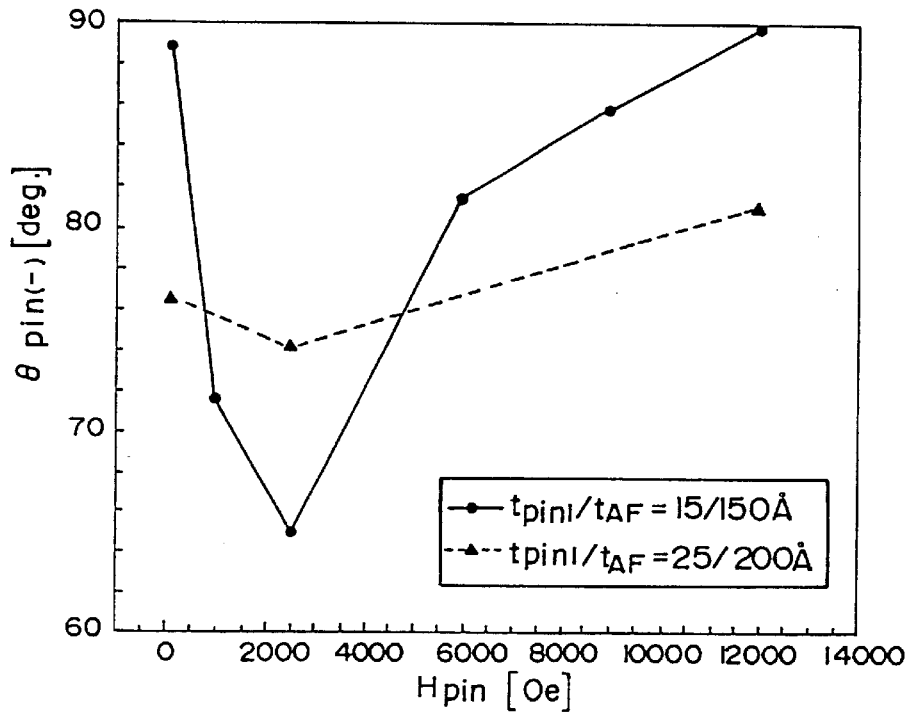
FIGS. 13A and 13B are graphs showing relationships between magnitude of magnetic field and magnetization angle when fixing the directions of magnetization of the pinned magnetic layer, FIG. 13B showing an enlarged graph of a part of FIG. 13A.
Figure 13B:
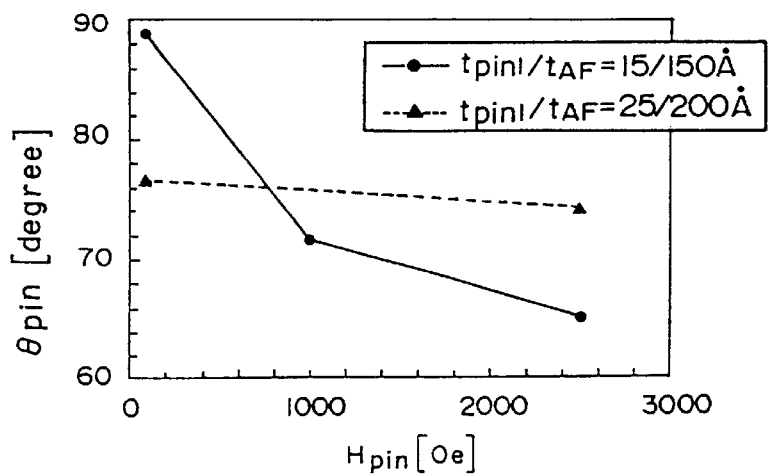

FIGS. 13A and 13B are graphs showing relationships between magnitude of magnetic field Hpin (Oe) and magnetization angle θpin when fixing the directions of magnetization of the pinned magnetic layer 4 in the above-described heat treatment in the magnetic field at 280° C. In this example, the second pinned magnetic layer 4a has a thickness of 25 Å. The first pinned magnetic layer 4c has a thickness of 15 Å. The anti-ferromagnetic layer 5 has a thickness of 150 Å.

Here, the magnetization angle θpin indicated on the vertical axis is an angle formed between a direction including orientations of magnetization of the pinned magnetic layer 4 (4a and 4c being in opposite orientations) and a direction of easy axis of magnetization indicating an anisotropic property of the free layer 2 (Y-direction). The horizontal axis shows the magnitude of magnetic field Hpin (Oe) to be applied.

In FIG. 13A, the magnetization angles θpin are obtained at 100, 1000, 2500, 6000, 9000, 12000 (Oe) and are indicated by dots. It can be seen that the magnetization angle θpin remains at an angle of approximately 90 degrees in a comparatively weak magnetic field below 100 Oe. However, the magnetization angle θpin declines towards the Y-direction in a comparatively high magnetic field between 500 to 2500 Oe. In order to clarify this aspect, an enlarged graph is shown in FIG. 13B, up to a value of 3000 Oe.

Referring to FIG. 13B, it can be seen that, after exceeding 100 Oe, the magnetization angle θpin steeply declines towards the Y-direction. Thus, it is understood that the first heat treatment in the magnetic field for fixing the orientations of magnetization of the pinned magnetic layer 4 is preferable in a comparatively low magnetic field of under 100 Oe.

Also, referring to the right part of the graph of FIG. 13A, it can be seen that a heat treatment in a comparatively high magnetic field of more than 9000 Oe is also valid. This implies that, by applying an external magnetic field having a strength exceeding an anti-parallel bonding magnetic field between the first and second pinned magnetic layers 4c and 4a, a heat treatment can be carried out under a condition that the directions of magnetization of the first and second pinned magnetic layers 4c and 4a are aligned. Particularly,. when the thickness of the anti-ferromagnetic layer 5 is reduced, the rate of change of resistance can be maintained while maintaining the magnetization angle θpin at approximately 90 degrees.

In FIGS. 13A and 13B, small triangles show values for the case where the second magnetic layer 4a and the first pinned magnetic layer 4c each has a thickness of 25 Å and the anti-ferromagnetic layer 5 has a thickness of 250 Å. These values shown by small triangles are indicated as a comparison to the values shown by dots. It can be seen the first and second pinned magnetic layers having the same thickness will not provide a preferable result.

Figure 14:
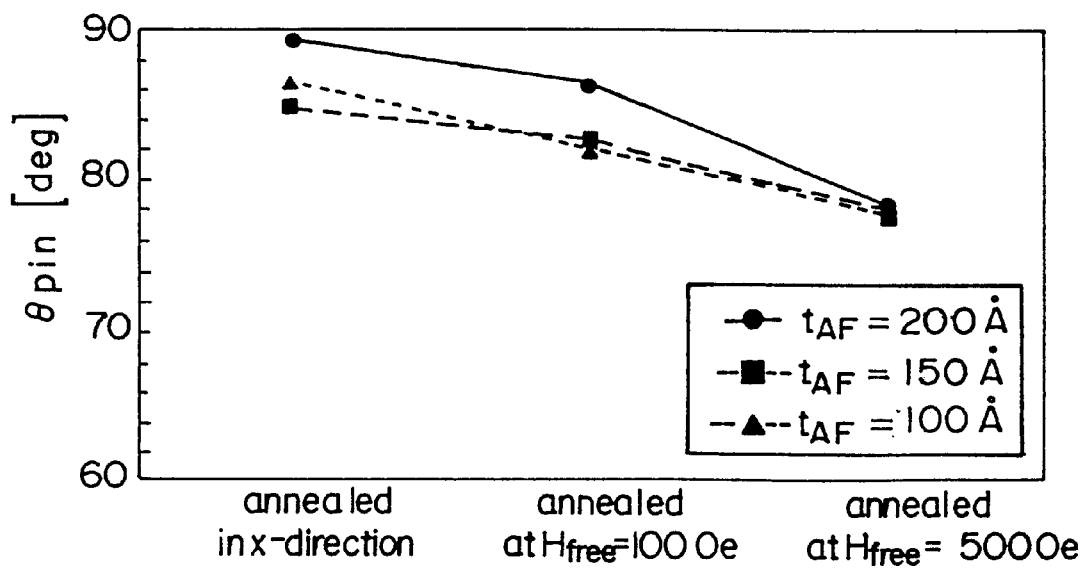
FIG. 14 is a graph showing relationships between magnitude of magnetic field and magnetization angle for a second heat treatment in a magnetic field at 230° C. for obtaining an isotropic effect of a free layer.

FIG. 14 is a graph showing relationships between magnitude of magnetic field Hfree (Oe) and magnetization angle θpin for the second heat treatment in the magnetic field at 230° C. The second heat treatment is implemented for obtaining an isotropic effect of the free layer 2. It can be seen that the magnetization angle θpin remains at approximately 90 degrees in a comparatively low magnetic field, where Hfree is between 10 to 500 Oe. When a magnetic field higher than 500 Oe is applied, it is understood that the direction of magnetization of the pinned magnetic layer 4 will incline towards the Y-direction. Also, particularly when the thickness of the anti-ferromagnetic layer is reduced, it is necessary to minimize Hfree. From the above results, it can be seen that the second heat treatment in the magnetic field should be carried out in a comparatively low magnetic field below 100 Oe.

After the second heat treatment in the magnetic field for strengthening the anisotropic property of the free layer 2, it is preferable that the heat treatment be carried out in a low magnetic field of the same direction or without any magnetic field. For example, a heat treatment for the organic isolating layer following the first and second heat treatments in the magnetic field is carried out in a magnetic field. Thus, in the first and second heat treatments, the magnetization angle θpin of the pinned magnetic layer 4 can remain in a preferably magnetized state. Therefore, with the spin-valve magnetoresistive head using the spin-valve magnetoresistive sensor of the present invention, a linear output characteristic can be obtained against the signal magnetic field Hsig from the recording medium.

Further, it is preferable to form the above-described spin-valve magnetoresistive sensor while applying a direct current magnetic field in the layer surface, so that a preferable direction of magnetic anisotropy is established in the free layer 2 and the pinned magnetic layer 4. The magnitude of magnetic field applied is preferably about 100 Oe.

Figure 1:
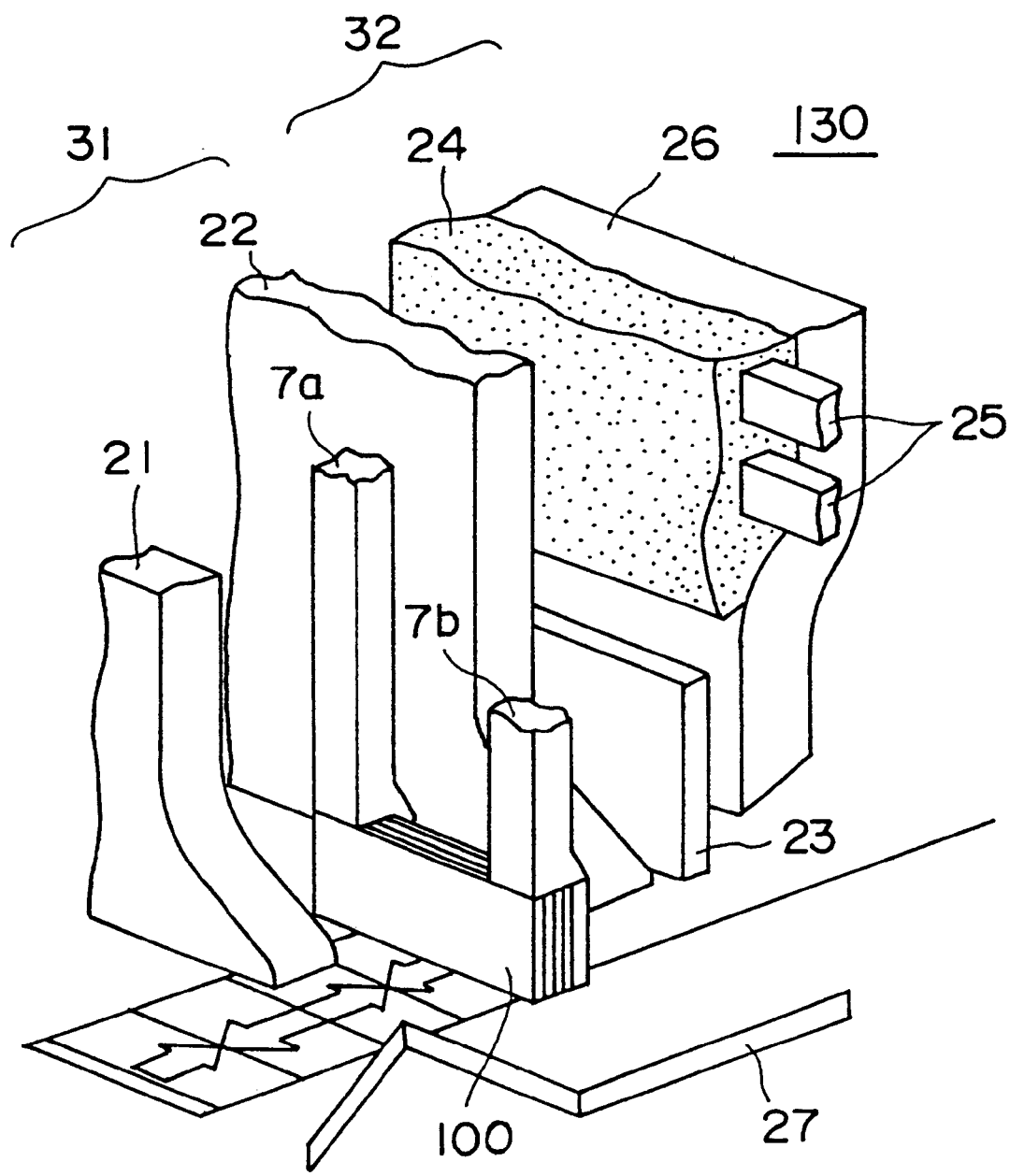
FIG. 1 is a partially cut-away perspective diagram of a composite magnetic head including the spin-valve magnetoresistive sensor of the related art.
Figure 2:
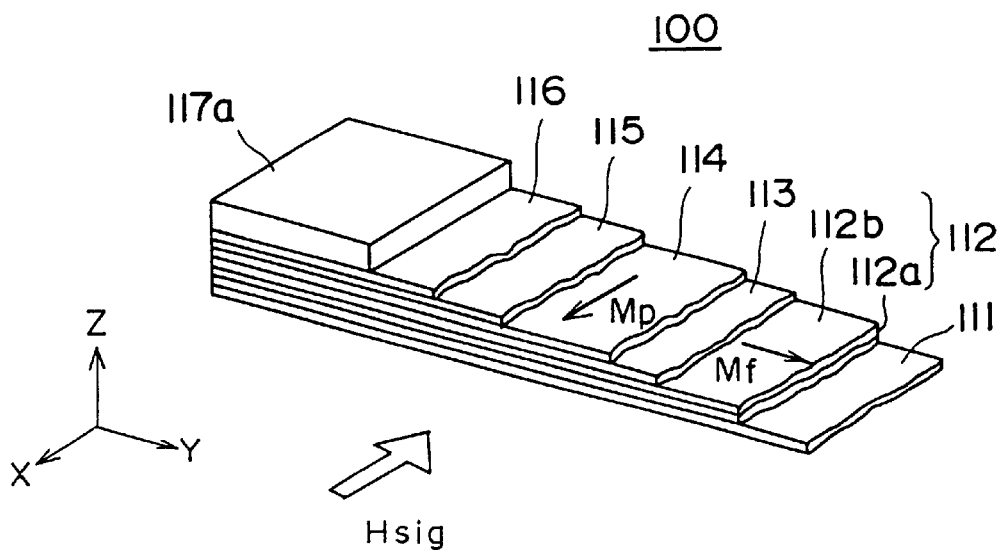
FIG. 2 is a partially cut-away perspective view showing a spin-valve magnetoresistive head using a spin-valve magnetoresistive sensor of the related art.
Figure 3:
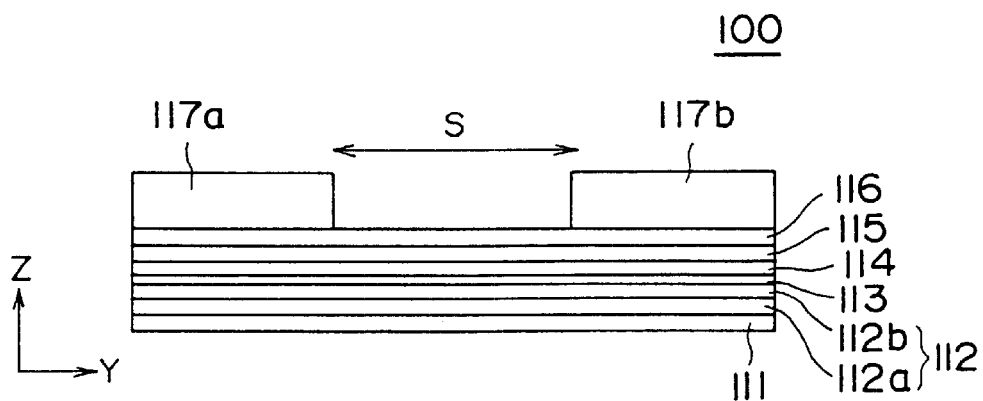
FIG. 3 is a side view showing the spin-valve magnetoresistive head shown in FIG. 2.

The inventors have also found that the above described steps of the manufacturing process applied to the multilayered pinned magnetic layer 4 of the present invention can equally be applied to the spin-valve magnetoresistive sensor of the related art with a single-layered pinned magnetic layer as shown in FIG. 2. Thus, improved characteristics are obtained for the spin-valve magnetoresistive sensor of the related art.

That is to say, when the steps of the manufacturing process for the spin-valve magnetoresistive sensor of the present invention are applied to the spin-valve magnetoresistive sensor of the related art, a spin-valve magnetoresistive sensor is obtained in which an angle between the direction of magnetization of the pinned magnetic layer and the easy axis of magnetization of the free layer is within ±20 degrees of a right angle and the magnitude of anisotropic magnetic field Hua of the pinned layer is greater than or equal to about 600 Oe.

This will be described with reference to FIG. 2. After forming the spin-valve magnetoresistive sensor layer, as a first step, a heat treatment within a magnetic field is provided for fixing the direction of magnetization of the pinned magnetic field 114 in the X-direction. In this first heat treatment within the magnetic field, the spin-valve magnetoresistive sensor layer undergoes a heat treatment at 280° C. for three hours with the magnetic field of about 3000 Oe in the X-direction being applied by means of a suitable magnetic field generating source.

Further, a step of a second heat treatment within a magnetic field is provided so as to strengthen the magnetic anisotropic property of the free layer 112 in the Y-direction. This is implemented in an environment with a lower temperature and a weaker magnetic field than the first heat treatment within the magnetic field. In this step of the second heat treatment within the magnetic field, the spin-valve magnetoresistive sensor layer undergoes a heat treatment at 230° C. for three hours with the magnetic field of less than 100 Oe in the Y-direction being applied by means of a suitable magnetic field generating source.

Figure 15A:
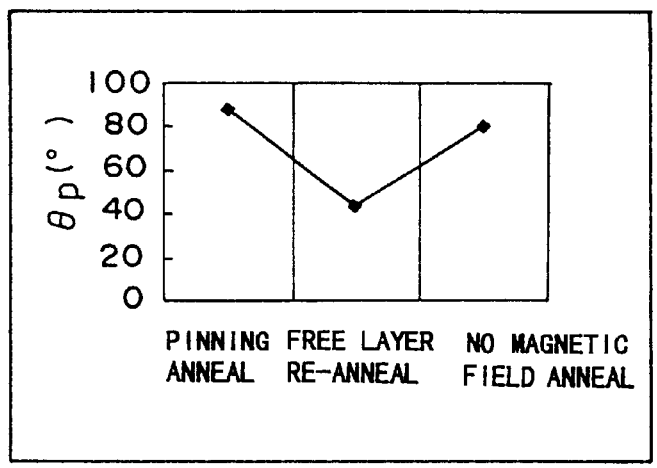
FIGS. 15A and 15B are diagrams showing graphs of heat treatment within a magnetic field applied for a manufacturing process of the spin-valve magnetoresistive sensor of the related art, FIG. 15A showing a case of high magnetic field and FIG. 15B showing a case of low magnetic field.
Figure 15B:
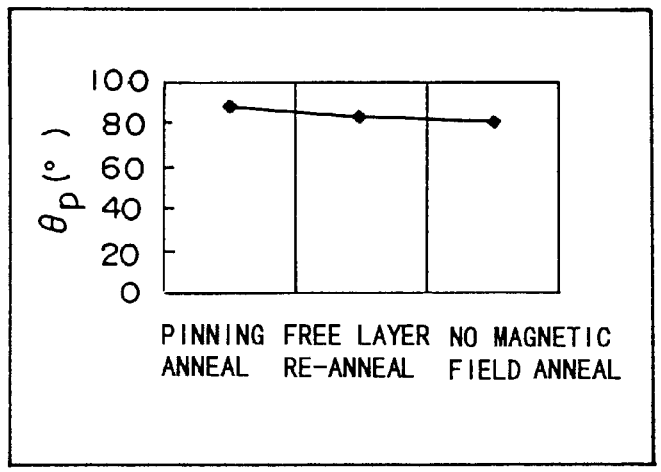

FIGS. 15A and 15B are diagrams showing graphs of a heat treatment within a magnetic field applied for a manufacturing process of the spin-valve magnetoresistive sensor of the related art. FIG. 15A shows a case where the second heat treatment is implemented with a high magnetic field of 3000 Oe. FIG. 15B shows a case where the second heat treatment is implemented with a low magnetic field of 100 Oe.

In FIGS. 15A and 15B, in the same manner as FIGS. 13A and 13B, the vertical axis indicates the magnetization angle Opin and thus shows the state of inclination in the Y-direction. The preferable state of the magnetization angle θpin is 90 degrees. Referring to FIGS. 15A and 15B, it can be seen that the magnetization angle θpin will be maintained at an angle of over 80 degrees under a low magnetic field condition of below 100 Oe, but will incline in the Y-direction under a high magnetic field condition of 3000 Oe.

It can be seen that it is valid to apply the above steps for the manufacturing process of the spin-valve magnetoresistive sensor having a single-layered pinned magnetic layer 114 of the related art. That is to say, after implementing the heat treatment within the magnetic field of the pinned magnetic layer, a magnetic anisotropic property may be provided to the free layer under a low magnetic field condition below 100 Oe.

Also, it is desirable that the steps after the heat treatment within the magnetic field for strengthening the anisotropic property of the free layer 112 is carried out in a low magnetic field of the same direction or without any magnetic field. For example, a heat treatment for the organic isolating layer following the first and second heat treatments in the magnetic field is carried out in a magnetic field. Thus, the magnetization angle θpin of the pinned magnetic layer 4 can remain in a magnetized state, as desired, in the first and second heat treatments. Therefore, with the spin-valve magnetoresistive head using the spin-valve magnetoresistive sensor of the present invention, a linear output characteristic can be obtained against the signal magnetic field Hsig from the recording medium.

Further, in order to provide a preferable direction of magnetic anisotropy to the free layer 2 and the pinned magnetic layer 4, it is also preferable to form the spin-valve magnetoresistive sensor of the related art while applying a direct-current magnetic field in the layer surface. The magnitude of the magnetic field to be applied is preferably about 100 Oe.

Further, the present invention is not limited to these embodiments, but variations and modifications may be made without departing from the scope of the present invention.

The present application is based on Japanese priority application No. 11-84592 filed on Mar. 26, 1999, the entire contents of which are hereby incorporated by reference.

What is claimed is:

1. A spin-valve magnetoresistive sensor comprising:
   a free layer of a ferromagnetic material;
   a non-magnetic layer provided on said free layer;
   a pinned layer provided on said non-magnetic layer; and
   a pinning layer of an anti-ferromagnetic material provided on said pinned layer, said anti-ferromagnetic material being an ordered alloy containing manganese;
   said pinned layer comprising:
      a first pinned layer of a ferromagnetic material;
      a second pinned layer of a ferromagnetic material provided on said first pinned layer;
      an intermediate layer interposed between said first and second pinned layers such that said first and second pinned layers establish a super-exchange interaction in an anti-parallel manner;
      said second pinned layer having a magnetic moment smaller than a magnetic moment of said first pinned layer.

2. The spin-valve magnetoresistive sensor as claimed in claim 1, wherein said first and second pinned layers are of substantially the same material with a thickness of said second pinned layer being smaller than a thickness of said first pinned layer.

3. The spin-valve magnetoresistive sensor as claimed in claim 1, wherein a difference between a thickness of said first pinned layer and a thickness of said second pinned layer is equal to or larger than about 5 Å.

4. The spin-valve magnetoresistive sensor as claimed in claim 1,
   wherein an orientation of magnetization of said first pinned layer is opposite to and substantially parallel to an orientation of magnetization of said second pinned layer,
   an angle formed between the direction of magnetization of said second pinned layer and an easy axis of magnetization of said free layer is a right angle or within ±20 degrees of said right angle, and
   said pinned layer, including said first and second pinned layers, has an effective anisotropic magnetic field Hua of greater than or equal to about 600 Oe.

5. The spin-valve magnetoresistive sensor as claimed in claim 1, wherein said pinning layer is made of a material selected from a group consisting of PdPtMn, PtMn, PdMn, NiMn and CrMn.

6. The spin-valve magnetoresistive sensor as claimed in claim 1, wherein said intermediate layer is made of Ru.

7. A method of manufacturing a spin-valve magnetoresistive sensor including:
   a free layer of a ferromagnetic material;
   a non-magnetic layer provided on said free layer;
   a pinned layer provided on said non-magnetic layer; and
   a pinning layer of an anti-ferromagnetic material provided on said pinned layer, said anti-ferromagnetic material being an ordered alloy containing manganese;
   said pinned layer comprising:
      a first pinned layer of a ferromagnetic material;
      a second pinned layer of a ferromagnetic material provided on said first pinned layer;
      an intermediate layer interposed between said first and second pinned layers such that said first and second pinned layers establish a super-exchange interaction in an anti-parallel manner;
      said second pinned layer having a magnetic moment smaller than a magnetic moment of said first pinned layer, said method comprising the steps of:
      a) forming a multilayered body in an order of the free layer, the non-magnetic layer, the first pinned layer, the intermediate layer, the second pinned layer, and the anti-ferromagnetic layer;
      b) implementing a first heat treatment within a magnetic field for regulating a magnetic state of said pinning layer and for fixing an orientation of magnetization of the first and second pinned layers; and
      c) implementing a second heat treatment within a magnetic field for regulating a magnetic anisotropic property of said free layer in an environment with a lower temperature and a weaker magnetic field than in said first heat treatment within the magnetic field.

8. The method of manufacturing a spin-valve magnetoresistive sensor as claimed in claim 7, wherein said step b) is carried out under the magnetic field of less than or equal to about 500 Oe or greater than or equal to about 7000 Oe at a temperature of approximately 280° C.

9. The method of manufacturing a spin-valve magnetoresistive sensor as claimed in claim 7, wherein said step b) is carried out under the magnetic field between about 20 and 100 Oe or greater than or equal to about 9000 Oe at a temperature of approximately 280° C.

10. The method of manufacturing a spin-valve magnetoresistive sensor as claimed in claim 7, wherein said step c) is carried out under the magnetic field of less than or equal to about 500 Oe at a temperature of approximately 230° C.

11. A magnetic head having a spin-valve magnetoresistive sensor comprising:
   a free layer of a ferromagnetic material;
   a non-magnetic layer provided on said free layer;
   a pinned layer provided on said non-magnetic layer; and a pinning layer of an anti-ferromagnetic material provided on said pinned layer, said anti-ferromagnetic material being an ordered alloy containing manganese;

said pinned layer comprising:
- a first pinned layer of a ferromagnetic material;
- a second pinned layer of a ferromagnetic material provided on said first pinned layer;
- an intermediate layer interposed between said first and second pinned layers such that said first and second pinned layers establish a super-exchange interaction in an anti-parallel manner;
- said second pinned layer having a magnetic moment smaller than a magnetic moment of said first pinned layer.

12. A magnetic recording medium drive apparatus having a magnetic head provided with a spin-valve magnetoresistive sensor comprising:

a free layer of a ferromagnetic material;

a non-magnetic layer provided on said free layer;

a pinned layer provided on said non-magnetic layer; and a pinning layer of an anti-ferromagnetic material provided on said pinned layer, said anti-ferromagnetic material being an ordered alloy containing manganese;

said pinned layer comprising:
- a first pinned layer of a ferromagnetic material;
- a second pinned layer of a ferromagnetic material provided on said first pinned layer;
- an intermediate layer interposed between said first and second pinned layers such that said first and second pinned layers establish a super-exchange interaction in an anti-parallel manner;
- said second pinned layer having a magnetic moment smaller than a magnetic moment of said first pinned layer.

* * * * *